United States Patent
Noda et al.

(10) Patent No.: US 8,198,883 B2
(45) Date of Patent: Jun. 12, 2012

(54) SEMICONDUCTOR DEVICE, INTERNAL CIRCUIT CONTROL SIGNAL MEASUREMENT CIRCUIT, AND DELAY TIME MEASUREMENT METHOD

(75) Inventors: Hiromasa Noda, Tokyo (JP); Kenji Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 413 days.

(21) Appl. No.: 12/588,760

(22) Filed: Oct. 27, 2009

(65) Prior Publication Data

US 2010/0109641 A1  May 6, 2010

(30) Foreign Application Priority Data

Oct. 30, 2008 (JP) .................. 2008-279774

(51) Int. Cl.
*H03D 13/00* (2006.01)
*G01R 31/3187* (2006.01)

(52) U.S. Cl. .................. 324/76.77; 324/750.3

(58) Field of Classification Search .................. None
See application file for complete search history.

(56) References Cited

U.S. PATENT DOCUMENTS

| 6,313,676 | B1 | 11/2001 | Abe et al. | |
| 6,586,962 | B2 * | 7/2003 | Sakurai et al. | .................. 326/16 |
| 7,378,891 | B2 * | 5/2008 | Gomm et al. | .................. 327/263 |

FOREIGN PATENT DOCUMENTS

JP   2000-269423   9/2000

\* cited by examiner

*Primary Examiner* — Minh N Tang
(74) *Attorney, Agent, or Firm* — McGinn IP Law Group, PLLC

(57) ABSTRACT

In a semiconductor device manufactured in a semiconductor chip, an internal circuit generates first and second internal circuit control signals which are produced as a delay time measurement start signal and a delay time measurement stop signal, respectively, which are sent to a delay time measurement circuit. The delay time measurement circuit measures a delay time between the start and the stop signals and outputs the delay time.

20 Claims, 7 Drawing Sheets

SEMICONDUCTOR DEVICE, INTERNAL CIRCUIT CONTROL SIGNAL MEASUREMENT CIRCUIT, AND DELAY TIME MEASUREMENT METHOD

This application is based upon and claims the benefit of priority from Japanese patent application No. 2008-279774, filed on Oct. 30, 2008, the disclosure of which is incorporated herein in its entirety by reference.

BACKGROUND OF THE INVENTION

1. Field of the Invention

The present invention relates to a semiconductor device and, in particular, to a semiconductor device for use in measuring timing of an internal control signal and a measurement circuit for measuring the timing of the internal control signal.

2. Description of Related Art

As miniaturization of a semiconductor manufacturing process has been advanced, serious influences have been brought to circuit operations due to variations of finished semiconductor devices. On designing the semiconductor devices, a timing margin has thus far been confirmed by assuring circuit operations which would be carried out under best conditions in all of terms, such as processes, voltages, temperatures, and under worst conditions in all of the above-mentioned terms.

However, when variations in processes seriously influence circuit operations, the above-mentioned designing method can not guarantee a margin for the circuit operations and makes it difficult to assure required properties.

Under the circumstances, proposal has been offered about a method of mounting, on each chip, a monitor circuit for monitoring a finished state of each device, detecting a monitoring result, and carrying out fine adjustment of, for example, internal voltages, to guarantee an operation margin of each circuit.

However, it has been found out that the above-mentioned method has had problems. One of the problems has been found out such that finished or completed transistors are varied in characteristics not only among product lots and wafers but also among chips of each wafer. Taking this into account, it might be considered that a plurality of monitor circuit are arranged at the sacrifice of a chip size on each chip in consideration of variations of characteristics within each chip. With this structure, it is necessary to allow margins among the respective measurement results of the plurality of the monitor circuits to some extent and to subtly control the internal voltages and so on by fine adjustment. But, such fine adjustment often encounters difficulties and such margins among the respective measurement results are liable to often give superfluous margins.

Herein, description will be made in detail about the method of monitoring the finished devices by the use of such a monitor circuit. As usual, a clock synchronization delay control circuit is incorporated in a semiconductor integrated circuit within a semiconductor device. In this case, the clock synchronization delay control circuit adjusts a delay time within internal circuits of the semiconductor integrated circuit by producing an internal clock signal which is synchronized with an external clock signal and which is delayed by n clock cycles of the external clock signal, where n is an integer.

The clock synchronization delay control circuit is classified into a SAD (Synchronous Adjustable Delay) type and a DLL (Delay Locked Loop) type, both of which use a delay monitor circuit. In order to precisely synchronize the internal clock signal with the external clock signal, the delay monitor circuit should have a delay time which is accurately equal to a sum of a delay time of a clock receiver and a delay time of an output buffer.

Thus, the clock synchronization delay control circuit is used to measure an input delay time tRC of the clock receiver relative to the external clock signal and an output delay time tDR of the output buffer. As a result, the clock synchronization delay control circuit makes it possible to measure the input delay times of the clock receiver and the output buffer, to perform operation in a delay measurement mode with the clock synchronization delay control circuit implemented in the semiconductor integrated circuit, and to set, in the delay monitor circuit, an actual signal delay time of each internal circuit and a delay time of outputting data which depends on a load state of an external data bus. Therefore, it is possible to accurately measure an actual delay time in the semiconductor integrated circuit including the delay monitor circuit.

Alternatively, disclosure is made in JP-A-2000-269423 (Patent Document 1) about a semiconductor integrated circuit which includes an improved clock synchronization delay control circuit. Specifically, the disclosed clock synchronization delay control circuit has a clock receiver which generates an internal clock signal CLK in response to an external clock signal and a synchronization delay control circuit and a delay monitor circuit both of which are given the internal clock signal CLK. In a delay measurement mode, the synchronization delay control circuit has a circuit which produces a pseudo internal clock signal DCLK acting as a signal to be measured. The pseudo internal clock signal DCLK is delayed by a clock driver and an output control circuit and is delivered as the internal clock signal to a data input/output circuit. The data input/output circuit sends a data signal to an external data bus through an output buffer and an output driver and fetches the data signal through a data receiver.

In this case, the delay monitor circuit sets a delay time which is equal to a sum of an output delay time tDR and a delay time tRC. Herein, the output delay time tDR represents a delay time from a generation time of the pseudo internal clock signal DCLK to an output time of the output data signal DOUT output through an external data bus while an input delay time tRC represents a delay time at a data receiver.

With this structure, when the pseudo data signal of "H" level is output to the external data bus, a data signal DAT is delayed by the input delay time tRC at the data receiver and is produced. In this case, a measurement start signal STR is produced in response to the pseudo internal clock signal DCLK while a measurement stop signal STP is produced in response to the data signal DAT. Responsive to the measurement start signal STR and the measurement stop signal STP, the delay monitor circuit can measure the delay time represented by the sum of the output delay time tDR and the input delay time tRC.

In Patent Document 1, it is pointed out that an actual delay time can be accurately measured by the delay monitor circuit when the delay time of the clock receiver is substantially equal to the delay time of the data receiver. In other words, the clock receiver of Patent Document 1 has a structure equivalent with the data receiver.

In addition, the external clock input is replaced by the pseudo data signal output to the external data bus. Under the circumstances, the delay time of the clock receiver can become equal to that of the data receiver.

In the case where designing is carried out on the assumption that the clock receiver and the data receiver have the same delay times and the external clock is replaced by the pseudo data signal in the above-mentioned manner, various problems take place as will be mentioned below. At any rate, it is to be noted that the measurement results obtained by the above-mentioned method do not accurately reflect circuit characteristics in a normal operation.

Specifically, the first problem is that the clock receiver and the data receiver do not always have the same characteristics even within the same chip. This is because variations of characteristics can not be neglected even in a single chip due to variations of manufacturing processes as channels of transistors of the semiconductor device become shorter and shorter and the semiconductor device has a high performance.

Practically, since the clock receiver and the data receiver are arranged in different positions from each other on each chip, they do not have the same characteristics. As a result, a difference of the delay times can not accurately be grasped at every chip in the method mentioned in Patent Document 1.

The second problem is that the external clock bus and the external data bus differ from each other in devices connected to them, in the number of the devices, and in interfaces connected to them and have different response characteristics from each other. This shows that the external clock bus and the external data bus are different from each other in signal waveforms, such as rise/fall waveforms, noise characteristics.

The third problem is that consideration is made in Patent Document 1 only about the delay times of the clock and the data. No consideration is made at all about delay times of any other internal control signals except the clock and the data signals used in the DRAM and the other semiconductor devices.

SUMMARY OF THE INVENTION

The present invention seeks to solve one or more problems mentioned above.

In one embodiment, there is provided a semiconductor device comprising:

an internal circuit which produces a first internal circuit control signal and a second internal circuit control signal which is generated when a predetermined delay time lapses after generation of the first internal circuit control signal;

a measurement signal generation circuit which is responsive to the first and the second internal circuit control signals and which produces the first internal circuit control signal as a delay time measurement start signal and the second internal circuit control signal as a delay time measurement stop signal; and a delay time measurement circuit which is responsive to the delay time measurement start signal and the delay time measurement stop signal to produce a delay time measurement result signal representative of a result of the delay time measurement.

In another embodiment, there is provided an internal signal timing circuit comprising:

an internal circuit which produces a first internal circuit control signal and a second internal circuit control signal produced when a predetermined delay time lapses after production of the first internal circuit control signal;

a measurement signal generation circuit which generates a delay time measurement start signal and a delay time measurement stop signal in response to the first and the second internal circuit control signals, respectively; and a delay time measurement circuit which produces a delay time measurement result signal representative of a result of the delay time measurement in response to the delay time measurement start signal and the delay time measurement stop signal.

In yet another embodiment, there is provided a delay time measurement method of measuring a delay time in an electronic circuit operated in response to first and second signals with a delay time interposed between the first and the second signals, comprising:

selecting the first and the second signals;

converting the first and the second signals into a delay time measurement start signal and a delay time measurement stop signal, respectively;

supplying the delay time measurement start signal and the delay time measurement stop signal to a delay time measurement circuit; and measuring, in the delay time measurement circuit, a time between the delay time measurement start signal and the delay time measurement stop signal to produce a result of measurement as the delay time.

BRIEF DESCRIPTION OF THE DRAWINGS

The above features and advantage of the present invention will be more apparent from the following description of certain preferred embodiments taken in conjunction with the accompanying drawings, in which.

DESCRIPTION OF EXEMPLARY EMBODIMENTS

Figure 1:
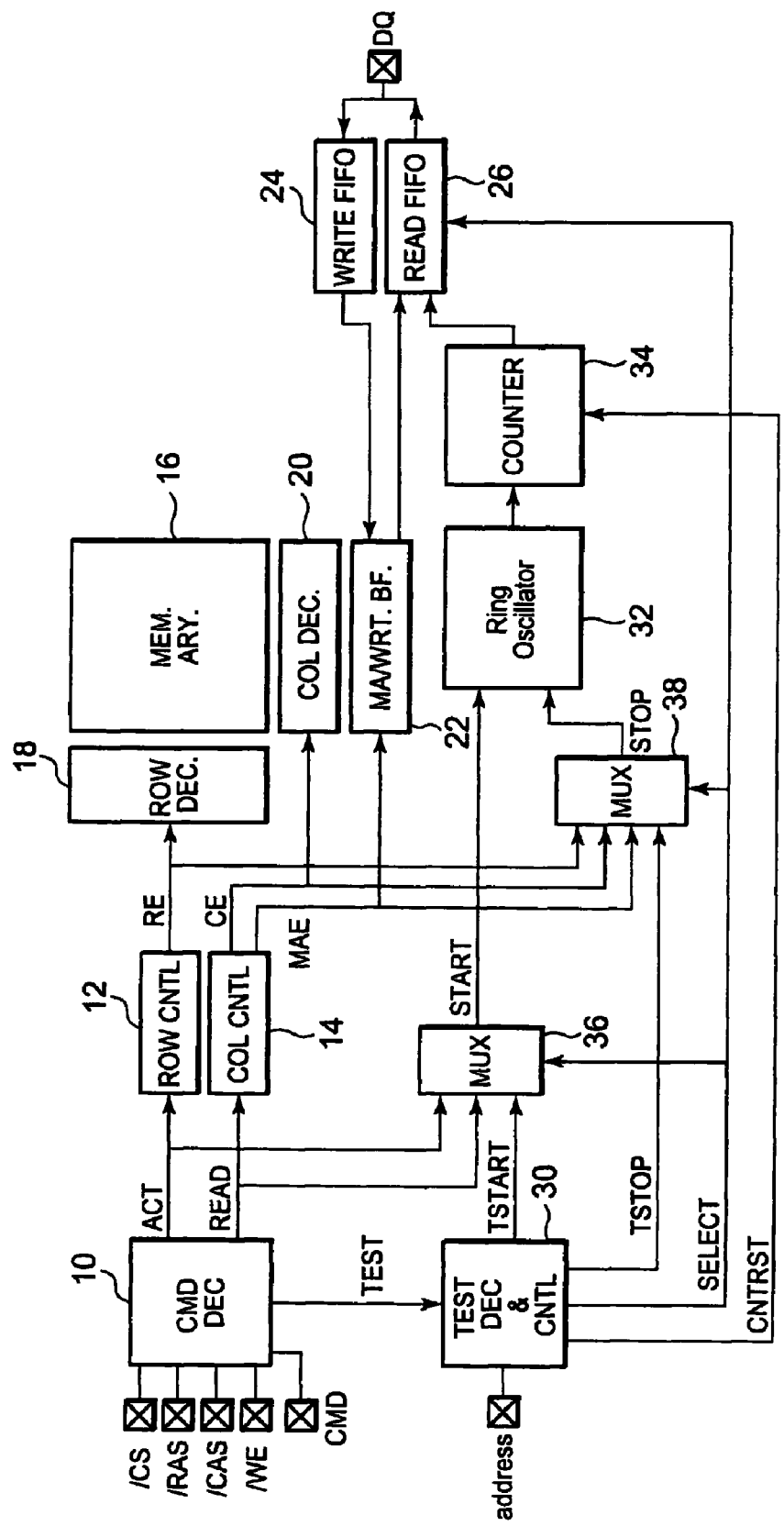
FIG. 1 is a circuit diagram for describing a semiconductor according to a first embodiment of the present invention.

Referring to FIG. 1, a semiconductor device according to a first embodiment of the present invention is specified by a DDR-SDRAM which is manufactured by a semiconductor integration technique and which may be therefore called a semiconductor integrated circuit, although the present invention is never restricted to the DDR-SDRAM alone.

The illustrated semiconductor comprises a command decoder (abbreviated to CMDEC) 10, a row control circuit (ROWCNTL) 12, a column control circuit (COLCNTL) 14, a memory array (MEMARY) 16, a row decoder (ROWDEC) 18, a column decoder (COLDEC) 20, a main amp/buffer circuit (MA/WRT) 22, a write FIFO (WRITEFIFO) 24, a read FIFO (READFIFO) 26, and a data output terminal (DQ). The above-enumerated circuits constitute an internal circuit of the semiconductor integrated circuit. The command decoder (CMDEC) 10 decodes each of commands (CMD), such as /CS, /RAS, /CAS, and /WE, into internal circuit control signals like in a usual manner. Moreover, it is to be noted that the illustrated command decoder (CMDEC) 10 further decodes a test command given from an external circuit (not shown) into a test mode signal (TEST) which will be described later in detail.

Furthermore, the semiconductor device shown in FIG. 1 includes a test control circuit (TESTDEC&CNTL) 30, a ring oscillator 32, a counter 34, a first multiplexer (MUX) 36, and a second multiplexer (MUX) 38. The ring oscillator 32 is connected to the first and the second multiplexers 36 and 38 in the illustrated manner.

Herein, a combination of the test control circuit 30 and the first and the second multiplexers 36 and 38 is collectively operated to generate a test start signal (namely, a delay time measurement start signal) START indicative of start of delay time measurement and a test stop signal (delay time measurement stop signal) STOP indicative of an end of the delay time measurement. In this connection, the combination of the test control circuit 30 and the first and the second multiplexers 36 and 38 may be referred to as a measurement signal generation circuit for generating the test start signal START and the test stop signal STOP. On the other hand, the ring oscillator 32 and the counter 34 serve as a delay time measurement circuit.

Specifically, the first multiplexer 36 is supplied from the command control circuit 10 with a bank activation code ACT and a read code READ and also supplied from the test control circuit 30 with an inside test start signal TSTART. On the other hand, the second multiplexer 37 is supplied with ROW decoded enable signal RE, a column decoded enable signal CE, and a main amplifier enable signal MAE and with the inside test start signal TSTART.

The illustrated test control circuit 30 is operable in response to the test start signal START to produce the inside test start signal TSTART and the inside test stop signal TSTOP. In addition, the test control circuit 30 supplies a selection signal (SELECT) to the first and the second multiplexers 36 and 38 and the read FIFO 36 and further supplies a counter reset signal (CNTRST) to the counter 34.

In the illustrated example, it is possible to measure, as a timing signal, each timing of the ROW decoded enable signal RE and the COLUMN decoded enable signal CE which are supplied from the row control circuit 12 and the column control circuit 14, respectively, together with timing of the main amplifier enable signal MAE sent from the column control circuit 14.

The combination of the first and the second multiplexers 36 and 38, the ring oscillator 32, and the counter 34 serves to measure each timing of the ROW decoded enable signal RE, the COLUMN decoded enable signal CE, and the main amplifier enable signal MAE in a manner to be described later. Herein, it is to be noted that each of the ROW decoded enable signal RE, the COLUMN decoded enable signal CE, and the main amplifier enable signal MAE serves to control the internal circuits included in the semiconductor device or the semiconductor integrated circuit and therefore may be called an internal circuit control signal or an internal timing signal.

In the illustrated semiconductor device, a measurement process of the above-mentioned internal circuit control signals are carried out by dividing the measurement process into a first step (1) of measuring an oscillation period of the ring oscillator 32 used to measure the internal timing signals and a second step (2) of measuring each timing of the internal circuit control signals. The measurement of the oscillation period of the ring oscillator 32 is performed under a wafer test condition (predetermined voltage and temperature).

Figure 2:
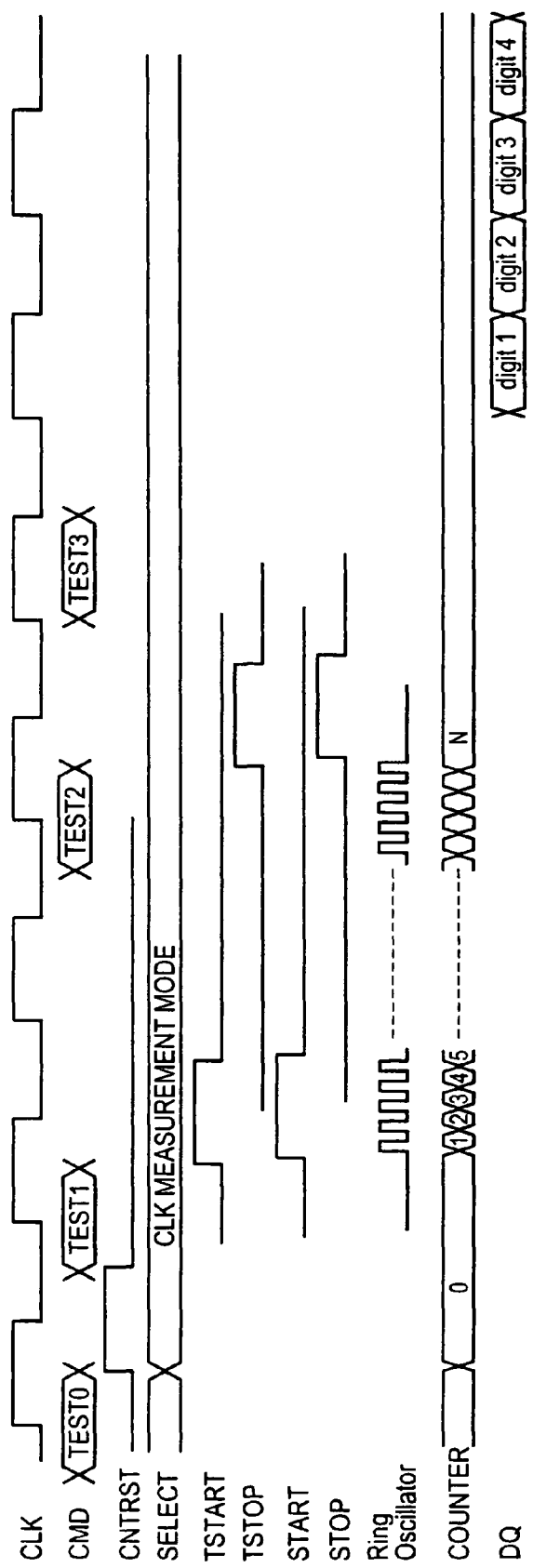
FIG. 2 is a waveform diagram for describing an operation of measuring an oscillation period of a ring oscillator located in the semiconductor device illustrated in FIG. 1.

The First Step (1):

Referring to FIG. 2, description is made about that measurement of the oscillation period of the ring oscillator 32 which is carried out under the wafer test condition.

In this event, the test mode signal TEST is given as a command (CMD) to the command decoder 10 from an external circuit (not shown) which may be called an additional or an external circuit. The command (CMD) may include a test mode signal TEST indicative of a test mode. Responsive to the test mode signal TEST, the command decoder 10 supplies the test control circuit 30 with test codes TEST0, TEST1, and TEST2 (may be called first, second, and third codes) in a manner illustrated in FIG. 2 in synchronism with a sequence of clocks CLK which may be given from the external circuit.

Supplied with the test code TEST0, the test control circuit 30 supplies the counter 34 with the counter reset signal (CNTRST) to reset the counter 34 into "0". Simultaneously, the test control circuit 30 sends the selection signal (SELECT) to the first and the second multiplexers (MUX) 36 and 38 as a control signal. As a result, the illustrated semiconductor device is put into a clock measurement mode.

Responsive to the selection signal (SELECT), the first and the second multiplexers 36 and 38 are put into states of selecting the inside test start signal TSTART and the inside test stop signal TSTOP, and output the test start signal START and the test stop signal STOP, respectively. This shows that paths including the first and the second multiplexers 36 and 38 are selected to bypass the test start signal START and the test stop signal STOP. On the other hand, the selection signal (SELECT) is given to the read FIFO 26 also. Therefore, the read FIFO 26 selects a path from the counter 34 instead of a path from the main amplifier/write buffer (MA/WRT BF) 22.

Next, the test code TEST1 is supplied to the test control circuit 30, as shown in FIG. 2. The test control circuit 30 delivers the inside test start signal TSTART to the first multiplexer 36 in response to the test code TEST1. The inside test start signal TSTART is sent as the test start signal TEST from the first multiplexer 36 to the ring oscillator 32. Responsive to the test start signal TEST, the ring oscillator 32 starts oscillations while the counter 34 connected to the ring oscillator 32 starts counting an oscillation output signal from the ring oscillator 32.

Thereafter, the test control circuit 30 produces the inside test stop signal TSTOP in response to the test code TEST2 generated when a predefined duration (two clock cycles) lapses after the test code TEST1. The inside test stop signal TSTOP is delivered from the test control circuit 30 through the second multiplexer 38 as the test stop signal STOP to the ring oscillator 32. Responsive to the test stop signal STOP, the ring oscillator 32 stops oscillations and the counter 34 stops counting the oscillation output signal. The counter 34 holds a count value at a time instant at which the counter 34 is stopped.

Subsequently, after one clock cycle lapses, the test control circuit 30 is supplied with the test code TEST3, as illustrated in FIG. 2, and makes the counter 34 output the counter value to the data output terminal (DQ). In FIG. 2, the count value is sent from the counter 34 at every one digit in synchronism with a rising edge and a down edge of each clock.

Inasmuch as a time difference between the test codes (namely, the second and the third test codes) TEST1 and TEST2 is previously defined by a test program, it is possible to calculate a practical oscillation period of the ring oscillator 32 implemented in the semiconductor chip or the semiconductor device by dividing the time difference by the counter value.

Figure 3:
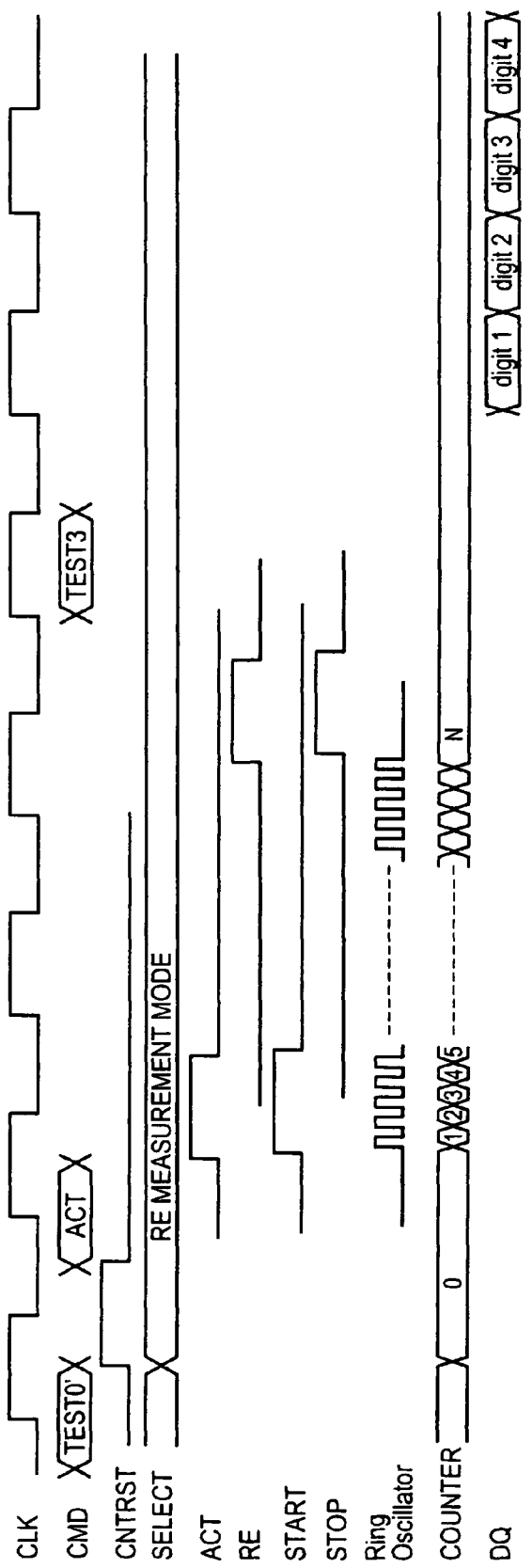
FIG. 3 is a waveform diagram for describing an operation of measuring timing of an internal signal used in the semiconductor device illustrated in FIG. 1.

(2) Second Step:

Referring to FIG. 3, description will be made about measuring the internal timing signals. In this event, the test control circuit 30 is supplied with a test code specified by TEST0', as illustrated in FIG. 3. The test code TEST0' is representative of an internal timing signal measurement mode, namely, test mode. Responsive to the test code TEST0', the test control circuit 30 generates the counter reset signal (CNTRST) and sends it to the counter 34. Responsive to the counter reset signal (CNTRST), the counter 34 is reset into "0" while the read FIFO 26 is connected to the counter 34. As a result, the read FIFO 26 is switched to the input path which selects the count value of the counter 34. This operation is similar to that described in conjunction with the first step (1).

However, it is to be noted that the test control circuit 30 produces the selection signal (SELECT) when the internal timing signals are measured in response to the test code TEST0'. As an example, it is assumed that the bank enable signal ACT and the row decoder enable signal RE are measured. In this case, the bank enable signal ACT and the row decoder enable signal RE are supplied to the first and the second multiplexers 36 and 38 as the first and the second internal circuit control signals, respectively.

Supplied with the selection signal (SELECT) from the test control circuit 30, the first and the second multiplexers 36 and 38 are put into the states of selecting the bank enable signal ACT and the row decoder enable signal RE, respectively, and form the paths which bypass these signals ACT and RE as the test start signal START and the test stop signal STOP, respectively. It is noted that the bank enable signal ACT and the row decoder enable signal RE are practically used in the semiconductor device, namely, the semiconductor chip.

Responsive to the bank enable command in the above-mentioned state, the command control circuit 10 supplies the bank enable signal ACT to the first multiplexer 36. The bank enable signal ACT is passed through the first multiplexer 36 and sent as the test start signal START to the ring oscillator 32. Consequently, the ring oscillator 32 starts oscillation operation while the counter 34 starts counting the oscillation output signal from the ring oscillator 32. Subsequently, the row control circuit 12 receives the bank enable signal ACT and thereafter outputs the row decoder enable signal RE. The row decoder enable signal RE is passed through the second multiplexer 38 and sent to the ring oscillator 32 as the test stop signal STOP. Responsive to the test stop signal STOP, the ring oscillator 32 stops oscillations while the counter 34 stops counting the oscillation output signal and holds the count value at the time when the counting operation is stopped in the manner mentioned in connection with the first step (1).

Next, when the test code TEST3 is given to the test control circuit 30, the test control circuit 30 makes the counter 34 supply the count value to the data output terminal DQ in the manner mentioned in conjunction with the first step (1). The count value of the counter 34 is multiplied by the oscillation period calculated in the first step (1) to obtain a delay time between the bank enable signal ACT and the row decoder enable signal RE.

Although the above-mentioned description is made about calculating the delay time between the bank enable signal ACT and the row decoder enable signal RE, a delay time between the column decoder enable signal CE and the main amplifier enable signal MAE can be also calculated by selecting the paths of the first and the second multiplexers 36 and 38 by the selection signal (SELECT). In this event, the bank enable signal ACT and the row decoder enable signal RE may be thus handled as the first and the second internal circuit control signals.

The first feature of the above-mentioned embodiment according to the present invention is that the semiconductor device, namely, the semiconductor chip is equipped with a conversion circuit which converts, into a digital signal read or output to the external circuit, a transition time difference between two internal circuit control signals (for example, ACT and RE) output from internal circuits (such as the command control circuit 10 and the row control circuit 12) located at different positions on the semiconductor chip.

From the above, it is readily understood that the above-mentioned embodiment has, as the internal circuits, the row control circuit 12 and the first and the second multiplexers 36 and 38 all of which collectively serve to supply the test start signal START and the test stop signal STOP to the ring oscillator 32 as the first and the second internal circuit control signals.

Moreover, the second feature of the above-mentioned embodiment is that calibration of the ring oscillator 32 is carried out by the use of a conversion circuit which converts the digital signal obtained in the above-mentioned manner into a real time. Specifically, the conversion circuit measures the count value of the ring oscillator 32 within a clock cycle given from the external circuit and converts the measured count value into the real time.

Modification:

The internal circuit control signals to be measured may not be restricted to the above. It is possible to measure a delay time between various internal control signals by increasing multiplexers in number or size. Although the foregoing description has been made as the example about the DDR-SDRAM, the present invention is applicable to any other logic circuits and/or memory devices having internal signals which are strict in timing and which are limited in number.

Thus, direct monitoring can be performed about speeds of the two internal circuit signals which are practically used in the actual operation in the embodiment. Therefore, any consideration is not needed about a difference in operations between a monitor circuit and an actual circuit which might have a variation within a chip. Consequently, a normally operation may be executed in each internal circuit even when a margin may be reduced in device adjustment.

Figure 4:
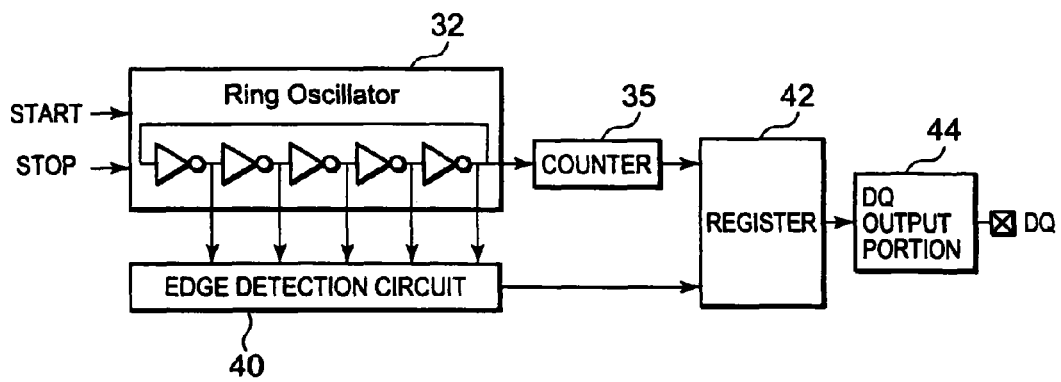
FIG. 4 is a schematic circuit diagram for describing an internal circuit control signal measurement circuit according to a second embodiment of the present invention.

Referring to FIG. 4, description will be made about a semiconductor device according to a second embodiment of the present invention, which is structured by a semiconductor integrated circuit formed in a semiconductor chip. The illustrated semiconductor device is specified by an internal circuit control signal measurement circuit which includes a ring oscillator 32, a counter 35 connected to the ring oscillator 32, and other circuit elements changed in relation to the ring oscillator 32 and the counter 35. The internal circuit control signal measurement circuit shown in FIG. 4 is operable in response to a test start signal START and a test stop signal STOP both of which are produced in the manner described before and which are used in the semiconductor device as internal circuit control signals, as mentioned above.

Specifically, the internal circuit control signal measurement circuit illustrated in FIG. 4 has an edge detection circuit 40, a register 42, and a DQ output portion 44 connected to the data output terminal DQ in addition to the ring oscillator 32 and the counter 35.

The ring oscillator 32 has odd number stages of circuit elements each of which may be structured by an inverter and which are connected in series. The illustrated ring oscillator 32 has five stages of the circuit elements which have output terminals connected to the edge detection circuit 40 to produce the stage output signals R0 to R4, respectively. Thus, the stage output signal R0 to R4 of the respective stages of the ring oscillator 32 are delivered to the edge detection circuit 40 which judges output voltages of the respective stages to produce a judgment result signal representative of a result of judgment. Therefore, the edge detection circuit 40 may be called a judgment result output circuit.

Specifically, the edge detection circuit 40 is operable as a phase detection circuit which detects an edge position (namely, a phase) at a time instant at which the ring oscillator 32 is stopped. The edge position or the phase detected by the edge detection circuit 40 is sent to the register 42 as the judgment result signal representative of the result of judgment and is registered into the register 42. In addition, a selected one of the output terminals of the stages in the ring oscillator 32 is connected to the counter 35. With this structure, the counter 35 counts a cycle number of the ring oscillator 32 representative of what times the ring oscillator 32 is cycled or circulated. A count value of the counter 35 is stored in the register 42. The register 42 outputs stored or registered information to the data output terminal DQ through the DQ output portion 44.

Figure 5:
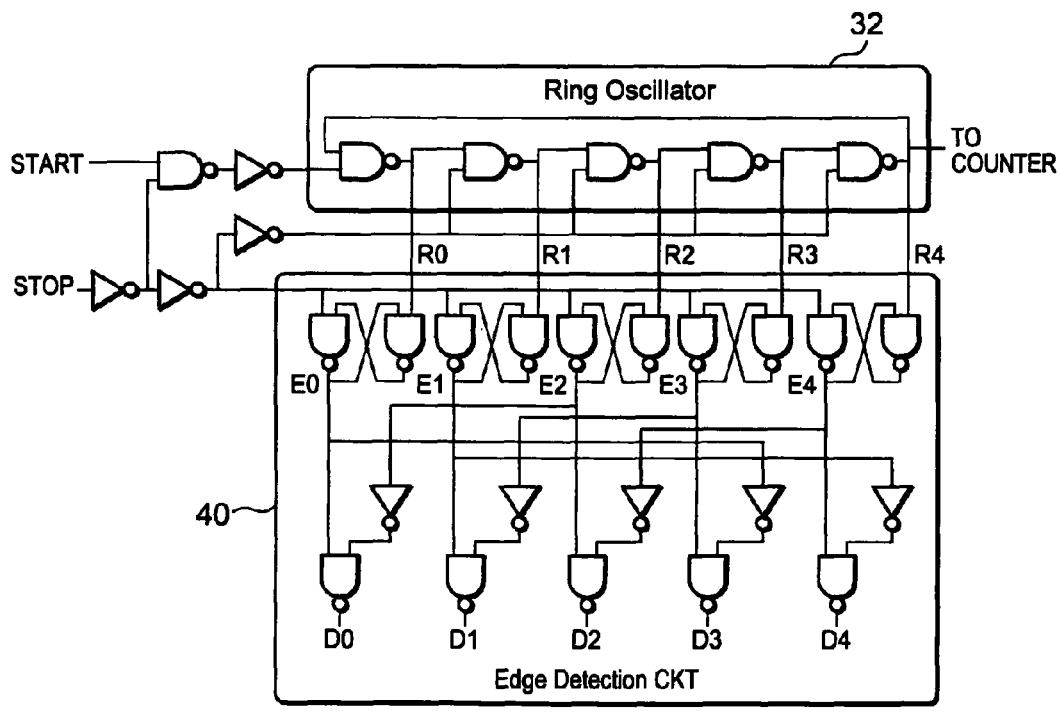
FIG. 5 is a circuit diagram for describing a part of the measurement circuit illustrated in FIG. 4 in detail.
Figure 6:
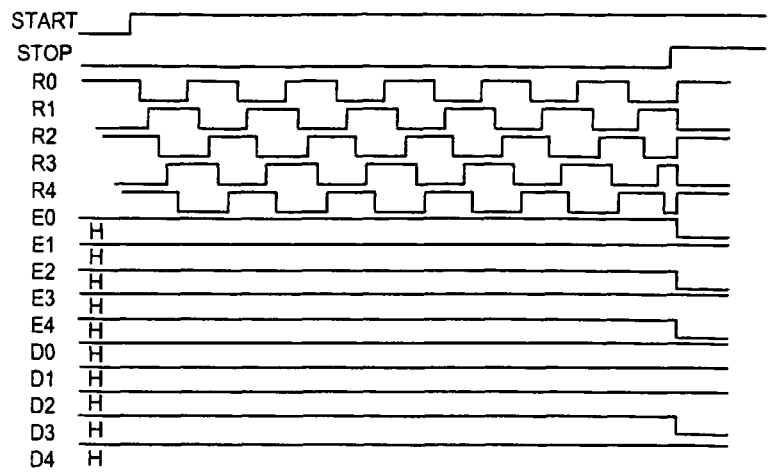
FIG. 6 is a waveform diagram for describing an operation of the circuit illustrated in FIG. 5.

Operation of the internal circuit control signal measurement circuit illustrated in FIG. 4 will be described with reference to FIGS. 5 and 6 also. FIG. 5 shows a circuit diagram of the ring oscillator 32 and the edge detection circuit 40 while FIG. 6 shows an operation wave form for explaining the operation of the ring oscillator 32 and the edge detection circuit 40.

The edge detection circuit 40 illustrated in FIG. 5 has five sets of arbiters which are formed by flip-flops composed of two NAND elements. The five sets of the arbiters are supplied with the stage output signals R0 to R4 from the respective stages of the ring oscillator 32 together with the test stop signal STOP sent through two inverters and produce arbiter output signals E0 to E4, respectively. The arbiter output signals E0 to E4 are given five NAND gates directly or through inverters. The five NAND gates outputs edge detection signal D0 to D4, respectively, which serve to represent the edge position or the phase.

More specifically, the edge detection signal D0 is produced in response to the arbiter output signal E0 and the arbiter output signal E2 given through the inverter to the NAND gate while the edge detection signal D1 is produced in response to the arbiter output signal E1 and the arbiter output signal E3 given through the inverter to the NAND gate. Likewise, the edge detection signal D2 is produced in response to the arbiter output signal E2 and the arbiter output signal E4 inverted by the inverter while the edge detection signal D3 is produced in response to the arbiter output signal E3 and the arbiter output signal E0 inverted by the inverter. Furthermore, the edge detection signal D4 is produced in response to the arbiter output signal E4 and the arbiter output signal E1 inverted by the inverter, as illustrated in FIG. 5.

It is assumed that the test start signal START and the test stop signal STOP are produced in response to the internal circuit control signals to be measured by the illustrated circuit and are sent to the ring oscillator 32 through multiplexers mentioned before and through inverters and a NAND gate, as shown in FIG. 5. At an initial state, both the test start signal START and the test stop signal STOP are put into low levels "L", as illustrated in FIG. 6.

Now, when the test start signal START takes a high level "H", as shown in FIG. 6, the ring oscillator 32 starts oscillations to generate an oscillation output signal which has a rising edge and a down edge. The rising edge and the down edge of each oscillation output signal are successively traveled and transmitted within the ring oscillator 32 and are output from the respective stages of the ring oscillator 32 as the stage output signals R0 to R4 as illustrated in FIG. 6. When the test stop signal STOP becomes the high level "H", the ring oscillator 32 stops the oscillations.

At the time instant at which the ring oscillator 32 is stopped, the stage output signal R0 to R4 of the ring oscillator 32 are judged by the arbiters composed of two NAND elements, as shown in FIG. 5. In this event, when Rn=L, the arbiter output signal En becomes "L" and when Rn=H, the arbiter output signal En becomes "H", where n=0, 1, 2, 3, or 4 in the illustrated example.

Herein, let detection be made about traveling the rising edge of each stage output signal. In this case, the stage output signal at a certain stage of the ring oscillator 32 takes "L" before the rising edge passes through the certain stage while the stage output signal at the certain state takes "H" after the rising edge passes through the certain stage. This shows that the rising edge exists between En=H and En+2=L and that the rising edge at the oscillation stop time can be detected by monitoring an AND result of En and the inverted signal of En+2. The AND result is produced from the edge detection circuit 40 as the edge detection signals D0 to D4.

With this structure, a measurement resolution is determined by a delay time between two stages of the circuit elements in the ring oscillator 32. In other words, it is possible to raise the measurement resolution up to the delay time between the two stages of the ring oscillator 32.

Figure 7:
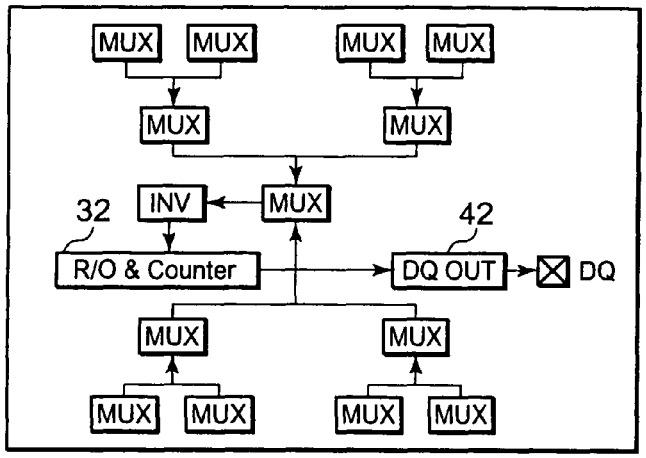
FIG. 7 is a block diagram for use in describing an arrangement of the ring oscillator and multiplexers coupled to the internal circuit control signal measurement circuit illustrated in FIG. 4.

Referring to FIG. 7, a chip image is diagrammatically shown so as to explain an arrangement of multiplexers which are located between internal circuit control signals to be measured and the ring oscillator (R/O) and the counter (depicted by 32). In FIG. 7, various multiplexers (MUX) are arranged from an uppermost (first) layer to a lowermost (sixth) layer. The four multiplexers (MUX) of the uppermost layer are given the internal circuit control signals which are practically used in the semiconductor chip, although the internal circuit control signals are omitted for brevity of description. In the illustrated example, two multiplexers (MUX) are arranged on the second layer under the uppermost layer while a single multiplexer is arranged together with an inverter on the third or center layer under the second layer. In addition, the ring oscillator 32 and the counter 35 illustrated in FIG. 4 are arranged together with the DQ output portion 42 and the data output terminal DQ on a next or the fourth layer under the center layer.

In addition, two multiplexers (MUX) are arranged on the fifth layer under the fourth layer while fifth multiplexers (MUX) are arranged on the lowermost or the sixth layer and are connected to the two multiplexers (MUX) on the fifth layer.

Each multiplexer (MUX) on the uppermost or the first layer is connected to the two multiplexers (MUX) on the second layer through a connection line or wiring of an equal length while the multiplexers (MUX) on the second layer are connected to the single multiplexer (MUX) on the third layer through a connection line equal in length to each other. As a result, a distance between the ring oscillator 32 and each multiplexer (MUX) on the first layer is equal to one another and, therefore, a delay time between the ring oscillator 32 and each multiplexer (MUX) on the first layer becomes equal to one another. This applies to a delay time between the ring oscillator 32 and each multiplexer (MUX) on the sixth layer.

Thus, the illustrated arrangement of the multiplexers (MUX) makes it possible to equalize the delay time between the ring oscillator 32 and each multiplexer (MUX) located on the uppermost or the lowermost layer. In other words, each internal circuit control signal is sent to the ring oscillator 32 through an identical number of the multiplexers (MUX) to provide the same delay time.

This structure facilitates comparison and judgment among delay times of internal circuit control signal similar in function to one another because no consideration is made about differences of lengths for the respective internal circuit control signals.

Figure 8:
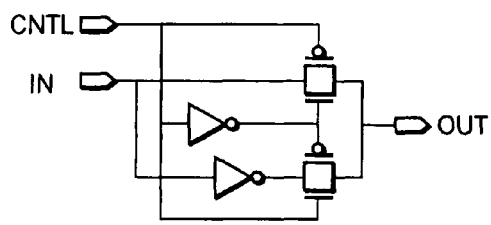
FIG. 8 is a circuit diagram for describing an output portion of the internal circuit control signal measurement circuit illustrated in FIG. 4.

Referring to FIG. 8, an example of a multiplexer (MUX) is illustrated which may be placed prior to the ring oscillator 32. The illustrated multiplexer (MUX) is given two input signals represented by CNTL and IN and enables to select either the rising edge or the down edge of each internal circuit control signal to be measured. For example, an upper path of the illustrated multiplexer (MUX) is selected on measuring the rising edge while a lower path of the multiplexer (MUX) is selected on measuring the down edge. The ring oscillator 32 is connected to the illustrated multiplexer (MUX) at which the path is selected and is always operated at a rising edge of an output signal sent from the illustrated multiplexer (MUX).

In the internal circuit control signal measurement circuit which may be called an internal signal timing measurement circuit, the edge detection circuit 40 is connected to the ring oscillator 32 to detect and hold a position of the rising edge or the down edge at a time at which the oscillations are stopped in the ring oscillator 32. Such a position of the rising edge or the down edge can be output to the external circuit.

With this structure, it is possible to accomplish a high measurement resolution which is higher than the oscillation period (1 ns or so) of the ring oscillator 32 itself and which may be, for example, 200 ps or less. The multiplexers (MUX) for the internal circuit control signals are arranged in a dispersed manner on the semiconductor chip to form the paths such that the connection lines between the ring oscillator 32 and each input multiplexer (MUX) become equal to one another. To this end, the paths from an input terminal of each internal circuit control signal to the ring oscillator 32 are formed through the multiplexers (MUX) connected in a tree-shape. In addition, each connection line on each layer has an identical length and provides an identical delay time one another. This serves to equalize the delay times between the ring oscillator 32 and each input multiplexer (MUX) and facilitates comparison among them because a time difference due to signal delays can be neglected which might result from a variation of the semiconductor chip.

Moreover, the multiplexer (MUX) of two inputs illustrated in FIG. 8 is located or arranged immediately before the ring oscillator 32 so that either an in-phase signal or a reverse phase signal of the input signal is selectively output from the multiplexer (MUX) to the ring oscillator 32. This arrangement makes it possible to operate the ring oscillator 32 in response to either the rising edge or the down edge without changing any structure of the ring oscillator 32. This structure dispenses with any converting means for converting the down edge into the rising edge and vice versa and therefore can avoid an increase of elements in number.

Thus, a difference of distances between the ring oscillator 32 and regions for the internal circuit control signals to be measured can be absorbed together with a difference among delay times. As a result, dependency which results from a difference of positions on the semiconductor chip can be absorbed.

According to the second embodiment of the present invention, the ring oscillator 32 on the semiconductor chip starts and stops oscillations in response to the clock signal and a main signal, namely, the internal circuit control signal, and both of oscillation times and the position of the rising edge in the ring oscillator 32 are output through the data output circuit to the external circuit. This means that timing of the main signal can be measured on each chip when a wafer is tested.

As mentioned before, the semiconductor device according to the second embodiment is specified by the internal circuit control signal measurement circuit which has the ring oscillator 32, the counter 35 counting the oscillation times, and the edge detection circuit 40 detecting the edge position of the ring oscillator 32 when the ring oscillator 32 is stopped. The internal circuit control signal measurement circuit may have a register which holds the oscillation times of the ring oscillator 32 and the result of the detection at the edge detection circuit 40 for a predetermined duration.

The internal circuit control signal measurement circuit according to the second embodiment may have a plurality of multiplexers (MUX) between the ring oscillator 32 and the internal circuits for generating the internal circuit control signals. The multiplexers (MUX) may be connected to one another in a tree-shape to equalize the lengths of the connection lines on each layer.

Figure 9:
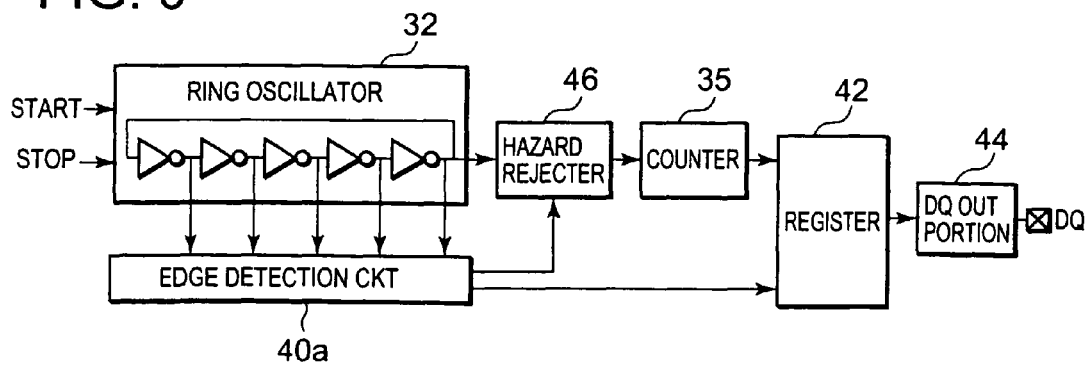
FIG. 9 is a circuit diagram for describing an internal circuit control signal measurement circuit according to a third embodiment of the present invention.

Referring to FIG. 9, description will be made about a semiconductor device according to a third embodiment of the present invention. The illustrated semiconductor device is specified by an internal circuit control signal measurement circuit similar to that illustrated in FIG. 4 except that a hazard rejecter 46 is located between the ring oscillator 32 and the counter 35 and an edge detection circuit 40a is somewhat different in structure and operation from the edge detection circuit 40 illustrated in FIG. 4. The hazard rejecter 46 is operable in response to an output signal supplied from the edge detection circuit 40a to produce a count stop signal when a predetermined condition appears. In other words, the hazard rejecter 46 serves to prevent the appearance of the predetermined condition.

Figure 10:
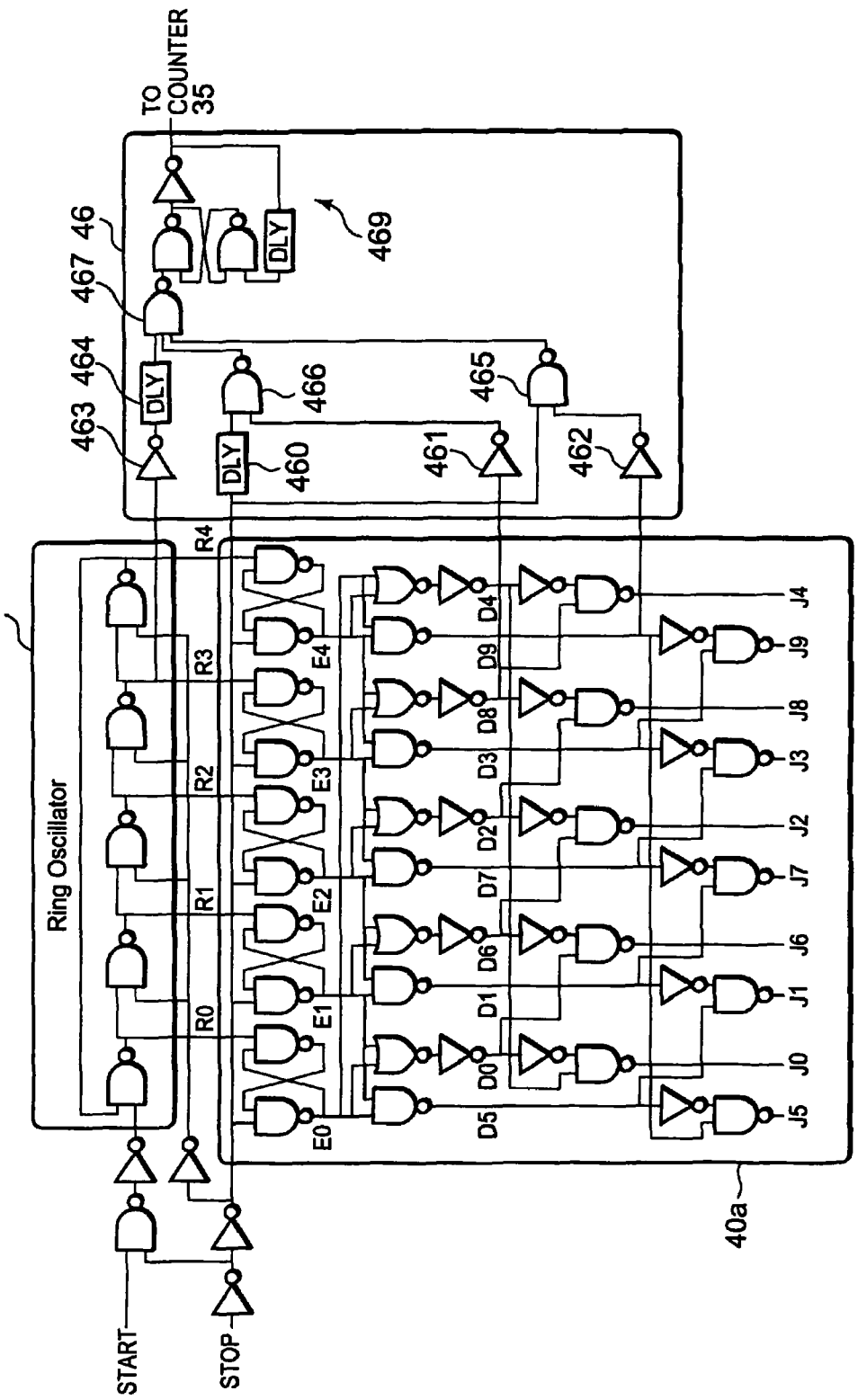
FIG. 10 is a circuit diagram for describing a part of the measurement circuit illustrated in FIG. 9 in detail.
Figure 11:
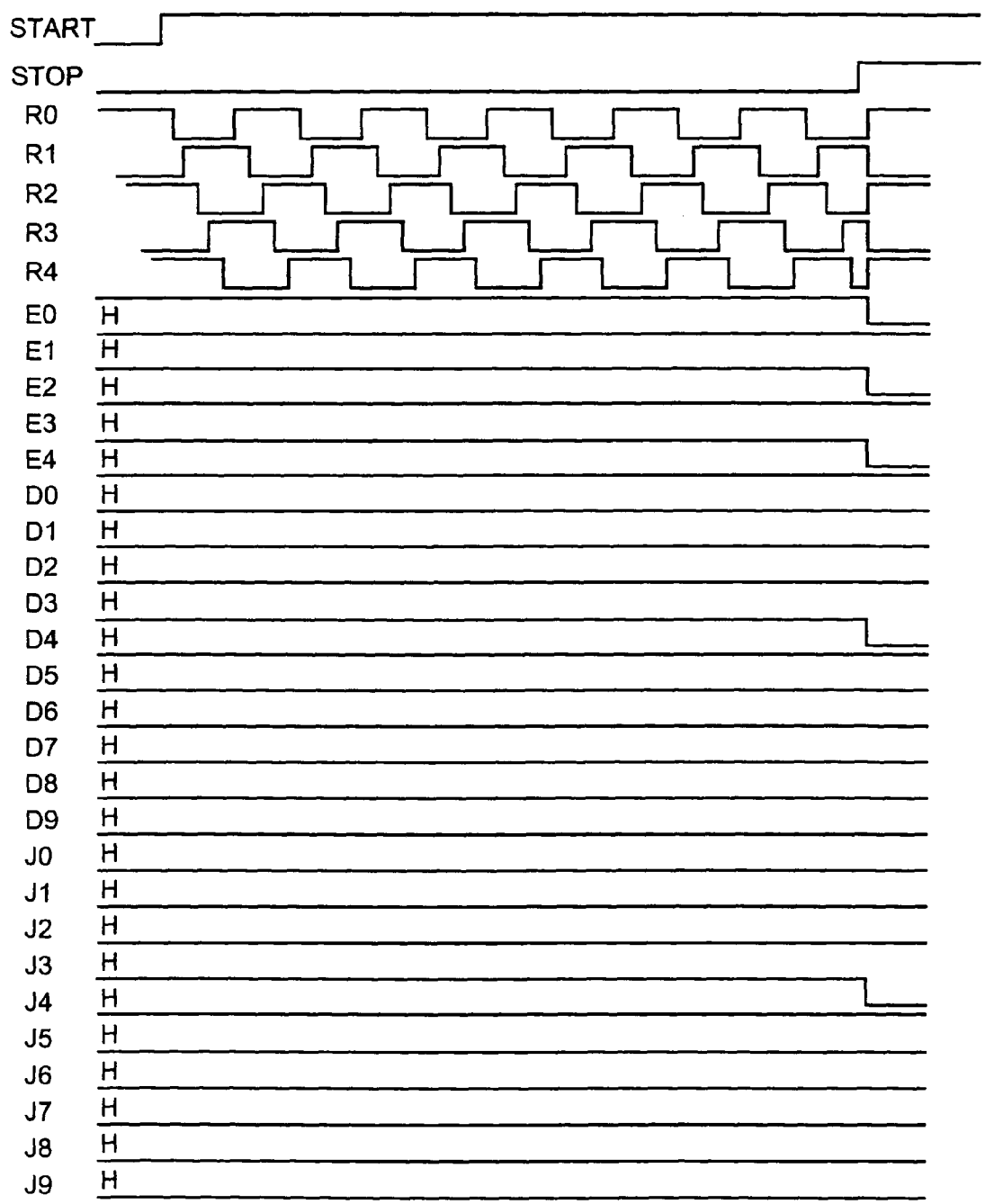
FIG. 11 is a waveform diagram for describing an operation of the measurement circuit illustrated in FIG. 10.

Referring to FIG. 10, the ring oscillator 32, the edge detection circuit 40a, and the hazard rejecter 46 are shown in detail in the form of a circuit diagram. FIG. 11 shows wave forms for describing operations of the above-mentioned circuits illustrated in FIG. 10. Responsive to the arbiter output signals E0 to E4, the edge detection circuit 40a produces not only the edge detection signals D0 to D4 but also additional edge detection signals D5 to D9. The edge detection signals D0 to D4 and the additional edge detection signals D5 to D9 may be collectively referred to as edge detection signals. To this end, the edge detection circuit 40a comprises NOR elements, NAND elements, and inverters connected in the illustrated manner to produce the edge detection signals D0 to D4 and the additional edge detection signals D5 to D9 and a logic circuit which executes a logic operation among the above-mentioned edge detection signals D0 to D9 to produce judgment result signals J0 to J9.

Specifically, the illustrated edge detection circuit 40a has the five arbiters which are structured in the same manner as those illustrated in FIG. 5 and which produces the arbiter output signals E0 to E4. On the other hand, the logic circuit which calculates the arbiter output signals E0 to E4 to produce the detection signals D0 to D9 has the NAND element and NOR element operable in response to the arbiter output signals E0 and E1 together with the NAND element and the NOR element operable in response to the arbiter output signals E0 and E4. Likewise, the remaining arbiter output signals are also supplied to two NAND elements and two NOR elements.

This shows that the arbiter output signals which are output from two adjacent ones of the stages of the ring oscillator 32 and which are generalized by En and En+1 are supplied to two sets of the NAND elements and the NOR elements. In addition, the NOR elements are connected to the inverters. With this structure, the edge detection signals D0, D6, D2, D8, and D4 are produced from the inverters while the edge detection signals D5, D1, D7, D3, and D9 are produced from the NAND elements.

Furthermore, the edge detection signal D0 is supplied through the inverter to the NAND element which is given the edge detection signal D4 and which serves to produce the judgment result signal J0. In addition, the edge detection signal D0 is directly given to an adjacent NAND element together with an inverted edge detection signal D6 to produce the judgment result signal J6. An inverted edge detection signal D5 and the edge detection signal D9 are given to the NAND element to produce the judgment result signal J5. The remaining edge detection signals are processed in a manner similar to the above to produce the judgment result signals J1 to J9.

The illustrated edge detection circuit 40a is operable when the ring oscillator 32 is stopped and detects that three or more consecutive stage output signals of the ring oscillator 32 take "H" level or "L" level. The edge detection circuit 40a judges that an edge is detected at an earliest one of the consecutive stages that has a shortest transmission delay time.

In FIG. 10, the hazard rejecter 46 has a delay circuit (DLY) 460 given the stop control signal STOP through two inverters as illustrated in FIG. 10, two inverters 461 and 462 inverting the edge detection signals D8 and D9, respectively, an inverter 463 inverting the stage output signal R3 of the ring oscillator 32, a delay circuit (DLY) 464 delaying an inverted stage output signal R3, a NAND element 465 connected to an input terminal of the delay circuit (DLY) 460 and the inverter 462, and a NAND element 466 connected to an output terminal of the delay circuit 460 and the inverter 461. In addition, a NAND element 467 is connected to the delay circuit 464 and the NAND elements 465 and 466 and is supplied with output signals thereof. An output of the NAND element 467 is supplied to a flip-flop structured by two NAND elements, an inverter, and a delay circuit (DLY).

Now, description will be made about heightening a measurement time resolution. The start control signal START and the stop control signal STOP are generated in the above-mentioned manner on the basis of the signal to be measured.

Referring to FIG. 11, the start and the stop control signals START and STOP are put into low levels "L" at an initial state. When the start control signal START is put into a high level "H", the ring oscillator 32 starts generating an output signal. A rising edge and a down edge are traveled through each stage of the ring oscillator 32, as shown by R0 to R4 in FIG. 11. The ring oscillator 32 stops oscillator when the stop control signal STOP becomes a high level "H". At a time the ring oscillator 32 stops oscillations, the respective stage output signals R0 to R4 of the ring oscillator 32 are sent to the arbiters formed by the two NAND elements to be judged.

Specifically, if Rn=L, the arbiter output signal En becomes "L" while, if Rn=H, the arbiter output signal En becomes "H". This means that the edge exists at the position where En=H and En+1=H, or where En=L and En+1=L. These states are detected by the combinations of the NOR elements and the inverters which produce the edge detection signals D0, 2, 4, 6, and 8 and are detected by the combinations of the NAND elements which produce D1, D3, D5, D7, and D9.

The example illustrated in FIG. 11 shows that E4=L and E0=L and the down edge is detected at the position where two consecutive arbiter output signals are put into the low levels "L". As a result, the edge detection signal D4 is put into the low level "L". Thus, the measurement time resolution is determined by one stage of the ring oscillator 32 (between two NAND elements in FIG. 10).

In the most cases, the position where En=H and En+1=H or En=L and En+1=L, appears at a single position. However, consideration should be made about appearance of a position where En=H, En+1=H, and En+2=H, or where En=L, En+1=L, and En+2=L. Otherwise, edge detection would be mistaken or wrong because two edge detection signals take the low levels "L".

In FIG. 10, comparison is made between the down edge judgment results (D0 and D6) or between the rising edge judgment results (D5 and D1) in order to avoid such a mistake. When an earlier one of the edge judgment results (D0 and D5 in this example) takes the low level "L", the illustrated edge detection circuit 40a comprises the logic circuit which serves to put a later one of the edge judgment results (D6 and 1 in the above-mentioned example) into the high level "H" and which produces the judgment result signals J0 to J9.

Herein, it is to be noted that, when R3=L in FIG. 10., the counter 35 illustrated in FIG. 9 is counted up by one to count the cycle number of the ring oscillator 32. Specifically, one cycle of the ring oscillator 32 is started by receiving the start control signal START and is practically finished when R4 becomes "H". This means that any count up operation should not be performed at the counter 35 when the ring oscillator 32 is stopped at the time when R3=L or when R4=H.

The hazard rejecter 46 is included in FIG. 9 so as to prevent such a wrong count up operation in the counter 35. To this end, the hazard rejecter 46 monitors a stopped state of the ring oscillator 32 to avoid occurrence of a specific state in the ring oscillator 32.

The hazard rejecter 46 illustrated in FIG. 10 is structured by a logic circuit for preventing the counter 35 from being counted up at a time when R3=L. Herein, it is assumed in FIG. 10 that the ring oscillator 32 is stopped at the time when R3=L. In this event, the edge detection signal D8 is put in the low level "L". Taking this into account, the hazard rejecter 46 has a logical circuit such that the three input NAND element 467 is turned into "L" when D8=L. Thus, the hazard rejecter 46 serves not to transmit the state of R3=L to the counter 35. In addition, the delay circuit 463 is inserted within a path of R3 to assure a transmission delay time for generation of D8.

Likewise, when the ring oscillator 32 is stopped at the time when R4=H, the resultant D9=L. This shows that, when D9=L, R3=L should not be transmitted to the counter 35. To this end, the illustrated hazard rejecter 46 has a logical circuit (462, 465) for interrupting the three input NAND element 467 when D9=L so as to avoid transmission of R3=L to the counter 35.

From this fact, it is readily understood that the internal circuit control signal timing measurement circuit according to the third embodiment of the present invention is equipped with the hazard rejecter 46 between the ring oscillator 32 and the counter 35 to interrupt the count up operation of the counter 35 when the specific state is caused to occur in the judgment results of the edge detection circuit 40a. Thus, it is possible to avoid a wrong count up operation of the counter 35 and to increase the time resolution to a single stage of the ring oscillator 32.

The internal circuit control signal measurement circuit according to the third embodiment of the present invention is operable to stop the ring oscillator 32 located in each chip by using the main signals used in each chip and the clocks in the above-mentioned manner. With this structure, it is possible to precisely output both of the cycle number of the ring oscillator 32 and a position of a rising edge of the ring oscillator 32 at a stopped time without any error to an external circuit and to measure each timing of the main signals used in each chip on testing a wafer. Moreover, the third embodiment can realize a high resolution by a single stage of the ring oscillator 32 in comparison with the second embodiment. At any rate, the measurement circuit according to the third embodiment is specified by the ring oscillator 32, the counter 35, the edge detection circuit 40a, the register 42, and the hazard rejecter 46 between the counter 35 and the ring oscillator 32.

Moreover, the edge detection circuit 40a according to the third embodiment is specified by a circuit for detecting the high levels "H" at two consecutive stages of the ring oscillator 32 and a circuit for detecting the low levels "L" at two consecutive stages of the ring oscillator 32. Furthermore, the edge detection circuit according to the third embodiment is specified by an additional circuit which detects the high levels "H" at three consecutive stages of the ring oscillator 32 and/or detects the low levels "L" at three consecutive stages. Furthermore, the additional circuit detects an earliest one of the three consecutive stages to judge that an edge exists at the earliest one of the three consecutive stages.

INDUSTRIAL APPLICABILITY

The present invention is widely applicable not only to the semiconductor device, such as DRAM, but also to any other electronic circuits which need to precisely measure and set timing of internal signals.

What is claimed is:

1. A semiconductor device comprising:
an internal circuit which produces a first internal circuit control signal and a second internal circuit control signal which is generated when a predetermined delay time lapses after generation of the first internal circuit control signal;
a measurement signal generation circuit which is responsive to the first and the second internal circuit control signals and which produces the first internal circuit control signal as a delay time measurement start signal and the second internal circuit control signal as a delay time measurement stop signal; and
a delay time measurement circuit which is responsive to the delay time measurement start signal and the delay time measurement stop signal to produce a delay time measurement result signal representative of a result of the delay time measurement.

2. A semiconductor device as claimed in claim 1, wherein:
the delay time measurement circuit comprises a ring oscillator and a counter;
wherein:
the ring oscillator starts oscillations in response to the delay time measurement start signal to produce an oscillation output signal and stops the oscillation output signal in response to the delay time measurement stop signal; and
the counter counting the oscillation output signal to produce a counted value as the delay time measurement result signal.

3. A semiconductor device as claimed in claim 2, wherein the delay time measurement circuit further comprises:
a phase detection circuit which is coupled to the ring oscillator and which produces phase information at a time at which the oscillation output signal is stopped.

4. A semiconductor device as claimed in claim 3, wherein:
the ring oscillator has a plurality of stages;
wherein:
the phase detection circuit comprises:

a judgment result output circuit which judges each output voltage of the stages of the ring oscillator to produce, as the phase information, a judgment result output signal representative of a result of judgment.

5. A semiconductor device as claimed in claim 1, wherein:
the delay time measurement circuit produces the delay time measurement start signal and the delay time measurement stop signal on the basis of a test mode signal which is given from an additional circuit different from the internal circuit and which is representative of a test mode.

6. A semiconductor device as claimed in claim 5, wherein:
the test mode signal is followed by a first test code, a second test code produced when a predefined duration lapses after the first test code;
the measurement signal generation circuit is operable in response to the first test code and the second test code and produces the first test code as the delay time measurement start signal and the second test code as the delay time measurement stop signal.

7. A semiconductor device as claimed in claim 5, wherein:
the measurement signal generation circuit comprises:
a test control circuit which produces the first and the second test codes after the test mode signal; and
a multiplexer circuit which supplies the delay time measurement circuit with the delay time measurement start signal and the delay time measurement stop signal by selecting the first and the second internal circuit control signals and the first and the second test codes.

8. A semiconductor device as claimed in claim 4, wherein the judgment result output circuit comprises a logic circuit which detects a rising edge and a down edge of each output voltage of the respective stages of the ring oscillator.

9. A semiconductor device as claimed in claim 8, wherein the logic circuit comprises an output circuit which keeps either one of the output voltages at the rising and the down edges to produce the judgment result signal.

10. A semiconductor device as claimed in claim 8, wherein the logic circuit comprises:
a circuit which detects the stage of the ring oscillator at which the output voltage rises or falls to produce the judgment result signal detected by a detected stage of the ring oscillator.

11. A semiconductor device as claimed in claim 1, wherein the first and the second internal circuit control signals are supplied to the delay time measurement circuit through first and second paths which have delay times substantially equal to each other.

12. A semiconductor device as claimed in claim 11, wherein each of the first and the second paths comprises multiplexers identical in number with each other.

13. A semiconductor device as claimed in claim 2, further comprising:
a hazard rejecter which is coupled to the ring oscillator and which prevents the counter from being counted up when the ring oscillator is stopped with a predetermined state taken at the respective stages.

14. An internal signal timing circuit comprising:
an internal circuit which produces a first internal circuit control signal and a second internal circuit control signal produced when a predetermined delay time lapses after production of the first internal circuit control signal;
a measurement signal generation circuit which generates a delay time measurement start signal and a delay time measurement stop signal in response to the first and the second internal circuit control signals, respectively; and a delay time measurement circuit which produces a delay time measurement result signal representative of a result of the delay time measurement in response to the delay time measurement start signal and the delay time measurement stop signal.

15. An internal signal timing circuit as claimed in claim 14, wherein:

the delay time measurement circuit comprises a ring oscillator and a counter;

wherein:

the ring oscillator starts oscillation to produce an oscillation output signal in response to the delay time measurement start signal and stops the oscillation output signal in response to the delay time measurement stop signal;

wherein:

the counter counts the oscillation output signal to produce a counted value as the delay time measurement result signal.

16. An internal signal timing circuit as claimed in claim 14, wherein:

the delay time measurement start signal and the delay time measurement stop signal are produced in response to a test mode signal given from an additional circuit different from the internal circuit.

17. A delay time measurement method of measuring a delay time in an electronic circuit operated in response to first and second signals with a delay time interposed between the first and the second signals, comprising:

selecting the first and the second signals;

converting the first and the second signals into a delay time measurement start signal and a delay time measurement stop signal, respectively;

supplying the delay time measurement start signal and the delay time measurement stop signal to a delay time measurement circuit; and measuring, in the delay time measurement circuit, a time between the delay time measurement start signal and the delay time measurement stop signal to produce a result of measurement as the delay time.

18. A delay time measurement method as claimed in claim 17, wherein the delay time measurement circuit comprises a ring oscillator and a counter;

the delay time measurement method comprising:

measuring an oscillation period of the ring oscillator before measuring the delay time between the first and the second signals.

19. A delay time measurement method as claimed in claim 18, wherein the oscillation period of the ring oscillator is measured by the use of test code signals produced at a predefined time interval.

20. A delay time measurement method as claimed in claim 19, wherein the delay time is calculated on the basis of a measurement result of the oscillation period of the ring oscillator.

* * * * *